(12) United States Patent
Gunn et al.

(10) Patent No.: US 11,843,410 B2
(45) Date of Patent: Dec. 12, 2023

(54) JOINT STEPPED OVERLAPPING HYSTERESIS GAIN CONTROL

(71) Applicant: L3Harris Technologies, Inc., Melbourne, FL (US)

(72) Inventors: Joshua D. Gunn, Farmington, UT (US); Ryan W. Hinton, Erda, UT (US); David W. Thorson, Salt Lake City, UT (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 0 days.

(21) Appl. No.: 17/702,390

(22) Filed: Mar. 23, 2022

(65) Prior Publication Data

US 2023/0308125 A1    Sep. 28, 2023

(51) Int. Cl.
*H04B 1/16* (2006.01)
(52) U.S. Cl.
CPC ...................................... *H04B 1/16* (2013.01)
(58) Field of Classification Search
CPC ........................................................ H04B 1/16
See application file for complete search history.

(56) References Cited

U.S. PATENT DOCUMENTS

| | | | | |
|---|---|---|---|---|
| 5,438,683 A * | 8/1995 | Durtler | ................ | H03G 3/3047 375/345 |
| 5,590,418 A | 12/1996 | Holoubek et al. | | |
| 2005/0191975 A1 | 9/2005 | Talwalkar et al. | | |
| 2012/0225631 A1 | 9/2012 | Spalink | | |
| 2018/0102764 A1 * | 4/2018 | Bacon | ................. | H03H 11/245 |

FOREIGN PATENT DOCUMENTS

GB          2060292 A        4/1981

OTHER PUBLICATIONS

European Search Report received for EP Patent Application No. 23161943.8, dated Jul. 18, 2023, 9 pages.

* cited by examiner

*Primary Examiner* — Janice N Tieu
(74) *Attorney, Agent, or Firm* — Workman Nydegger (57) ABSTRACT

Signal processing to compensate for gain control output spikes caused by steps in a digital step attenuator. A method includes receiving a changing power input signal at a receiver. The method includes determining that a change in power of the input signal will cause a step attenuator to change its attenuation in a step of a predetermined amount. The method further includes based on determining that the change in power of the input signal will cause a digital step attenuator to change its attenuation in a step of a predetermined amount, causing a variable attenuator to change its attenuation by an amount related to the predetermined amount at a time coinciding with a time when the step attenuator changes its attenuation by the predetermined amount. The method further includes outputting a gain-controlled output signal resulting from applying the step attenuator and the variable attenuator to the changing power input signal.

20 Claims, 5 Drawing Sheets

JOINT STEPPED OVERLAPPING HYSTERESIS GAIN CONTROL

BACKGROUND

Background and Relevant Art

Numerous different devices can be equipped with communications systems for transmitting and/or receiving communications. These communications may be transmitted to, or received from, any number of different external targets, endpoints, network nodes, or systems. As an example, communications can be sent and received by walkie-talkies, cell phones, vehicles, airplanes, rotary aircraft, ships, satellites, and so on.

Communications can have a need to be implemented over a large dynamic range. For example, consider an RF receiver that is configured to receive communications from a mobile platform. For example, consider a receiver implemented on an aircraft configured to receive communications from a transmitter on another aircraft. If the two aircraft are in close proximity to one another, the signal received by the aircraft with the receiver will be much stronger than if the aircraft are less proximate to each other. Alternatively, consider the case where the receiver is able to receive RF communications from any one of a number of different transmitters located in different locations. For example, a communication from a satellite will be much weaker than a communication from a terrestrial communication transmitter located proximate the receiver, particularly when there is a clear line of sight between the terrestrial communication transmitter and the receiver.

Typically, a receiver includes a detector that is able to process communication signals in conjunction with an analog-to-digital converter to convert the signals to a digital communication signal that is able to be read at the receiver. However, the detector is typically only able to handle a very limited dynamic range. For example, the detector may only be able to handle signals in a 1 to 2 dB range. However, the overall receiver may be required to receive and process signals over a much larger dynamic range. For example, a given receiver system may be required to handle receiving RF communications in a −40 dBm to 30 dBm range. This range represents a range of very weak signals to very strong signals.

To handle this dynamic range, a receiver typically includes an attenuator. The attenuator attenuates strong signals so that all signals received by the detector are closer to the lower end of the dynamic range. For example, the receiver may include an attenuator that attempts to cause all signals provided to the detector in the receiver to be about −40 dBm. Given that received signals can be, in the present example, between −40 dBm to 30 dBm, the attenuator necessarily needs to be variable depending on the strength of the received signal. For example, if a signal is received at a signal strength of −40 dBm, then no attenuation needs to be performed. In contrast, if a signal is received at a signal strength of 30 dBm, then 70 dB of attenuation needs to be performed. Similarly, if a signal is received at a signal strength of 10 dBm, then attenuation of 50 dB needs to be performed. And so forth.

Some systems can implement an attenuator that is somewhat variable in nature over the entire dynamic range. For example, a variable voltage attenuator (VVA) can be implemented where a control voltage that is approximately proportional or inversely proportional to received signal strength is used to control the attenuator to attenuate received signals as appropriate. However, such an attenuator can cause distortion in the received signals, especially at the margins of the dynamic range. Thus, for example, when a received signal is approximately 5 dB above a desired received level, a relatively clean attenuation can be performed as compared to attenuations performed when the received signal is approximately 30 dB above the desired level or when the received signal is approximately −40 dBm. Alternatively, a VVA that has low distortion across the dynamic range may be expensive to implement and/or acquire. Alternatively, or additionally, a VVA having a high dynamic range may have a limited frequency bandwidth, or other undesirable limitations. Therefore, it would be useful to implement a receiver system that has a high dynamic range while still being implemented in an economically advantageous fashion, with limited distortion.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a method that may be practiced in a communication environment. The method includes acts for signal processing to compensate for gain control output spikes caused by steps in a digital step attenuator (DSA). The method includes receiving a changing power input signal at a receiver. The method includes determining that a change in power of the input signal will cause a step attenuator to change its attenuation in a step of a predetermined amount. The method further includes based on determining that the change in power of the input signal will cause a DSA to change its attenuation in a step of a predetermined amount, causing a variable attenuator to change its attenuation by an amount related to the predetermined amount at a time coinciding with a time when the step attenuator changes its attenuation by the predetermined amount. The method further includes outputting a gain-controlled output signal resulting from applying the step attenuator and the variable attenuator to the changing power input signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Some embodiments illustrated herein use coordinated control of one or more coarse gain control elements and one or more fine or continuous gain control elements to allow a wide range of gain/attenuation without having discontinuities in the gain over time. For example, some embodiments use a DSA (which attenuates signals in discrete steps) having a wide dynamic range in combination with a VVA with a limited dynamic range (e.g., limited by one or more orders of magnitude), with respect to the wide dynamic range, to allow for implementation of a signal attenuator that has wide dynamic range, but nonetheless has fine attenuation controls. Note that as discussed above, the coarse gain control element and the fine gain control element are coordinated. This is done to prevent power spikes in a signal from occurring when a step occurs at the coarse gain element. In particular, while the fine gain control element is typically implemented using a more gradual attenuation, when a step occurs at the coarse gain element, a corresponding large change in attenuation is affected at the fine gain control element as well to prevent power spikes in an output signal. This will be explained in more detail below.

Figure 1A:
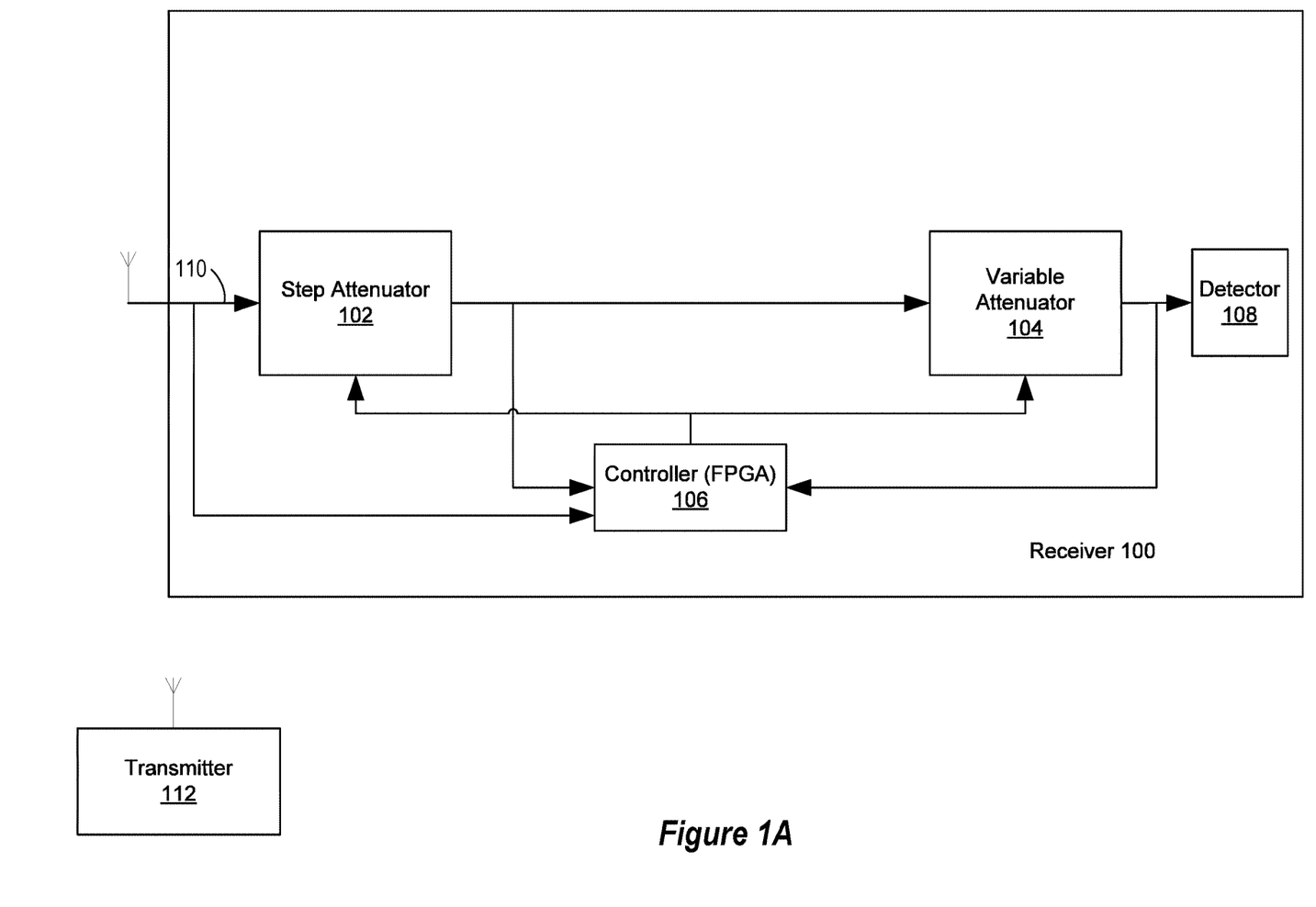
FIG. 1A illustrates a system for compensating for power spikes caused by steps in a DSA.

Referring now to FIG. 1A an example receiver 100 is illustrated. The receiver 100 receives input signals from one or more transmitters. For example, the receiver 100 may receive signals from a variety of transmitters on a variety of platforms. These transmitters are represented by the transmitter 112. For example, the receiver 100 may be implemented on an aircraft and may receive signals from other aircraft, ground units, satellite systems, underwater vehicles, or other systems. The signals received at the receiver 100 may be received across a number of power levels thus requiring the receiver 100 to have an appropriate dynamic range for expected powers received at the receiver 100. As noted previously, this is accomplished by attenuating received signals to an appropriate level for further processing in the receiver 100.

Figure 1B:
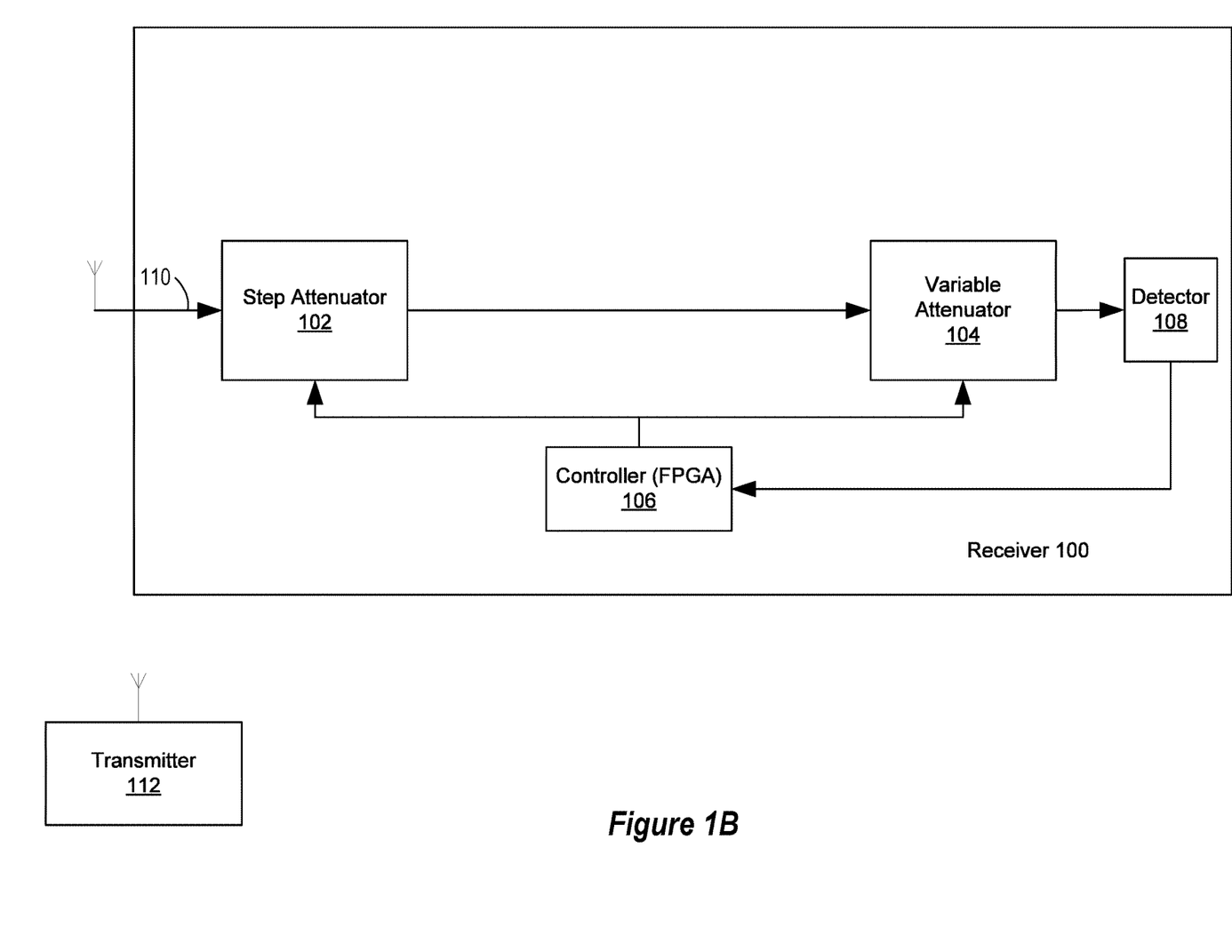
FIG. 1B illustrates an alternative system for compensating for power spikes caused by steps in a DSA.

In the example illustrated in FIGS. 1A and 1B, the received input signal 110 is provided to a step attenuator 102, which is a coarse attenuator. The step attenuator 102 attenuates the input signal 110 in large steps corresponding to the strength of the input signal 110 at the step attenuator 102. In particular, the controller 106 either directly or indirectly measures the input power of the input signal 110 and causes the step attenuator 102 to attenuate the input signal 110 to a level appropriate for the variable attenuator 104, and further the detector 108. For example, consider the case where the receiver 100 has an intended dynamic range for input signals of between −40 dBm and 30 dBm. In this case, typically, the detector 108 will expect an input signal 110 of approximately −40 dBm. Thus, the step attenuator 102 and the variable attenuator 104 attenuate any input signal 110 to that level. In one example, assuming that the input signal 110 is 20 dBm with a decreasing trajectory (i.e., the signal is getting weaker over time), and the variable attenuator 104 has a 5 dB attenuation range, the step attenuator 102 is configured by the controller 106 to attenuate the input signal 110 by 55 dB. This results in a step attenuated signal of approximately −35 dBm at the output of the step attenuator 102. The variable attenuator 104 can be controlled by the controller 106 to provide an additional attenuation of 5 dB to cause the signal received at the detector to be −40 dBm.

Note that the controller 106 can detect the trajectory of the input signal 110, and in some embodiments, the speed at which the input signal 110 is changing. Thus, for example, the controller 106 can (either directly or indirectly) detect whether the input signal 110 is getting weaker or stronger, and the rate at which the signal strength is changing. Using this information, along with the signal strength, the controller 106 can appropriately control the step attenuator 102 and variable attenuator to provide a signal of a desired signal strength to the detector 108.

Timing of when the step attenuator 102 and the variable attenuator attenuate an input signal is taken into consideration to prevent power spikes in the output of the variable attenuator 104 to the detector 108.

Figure 2:
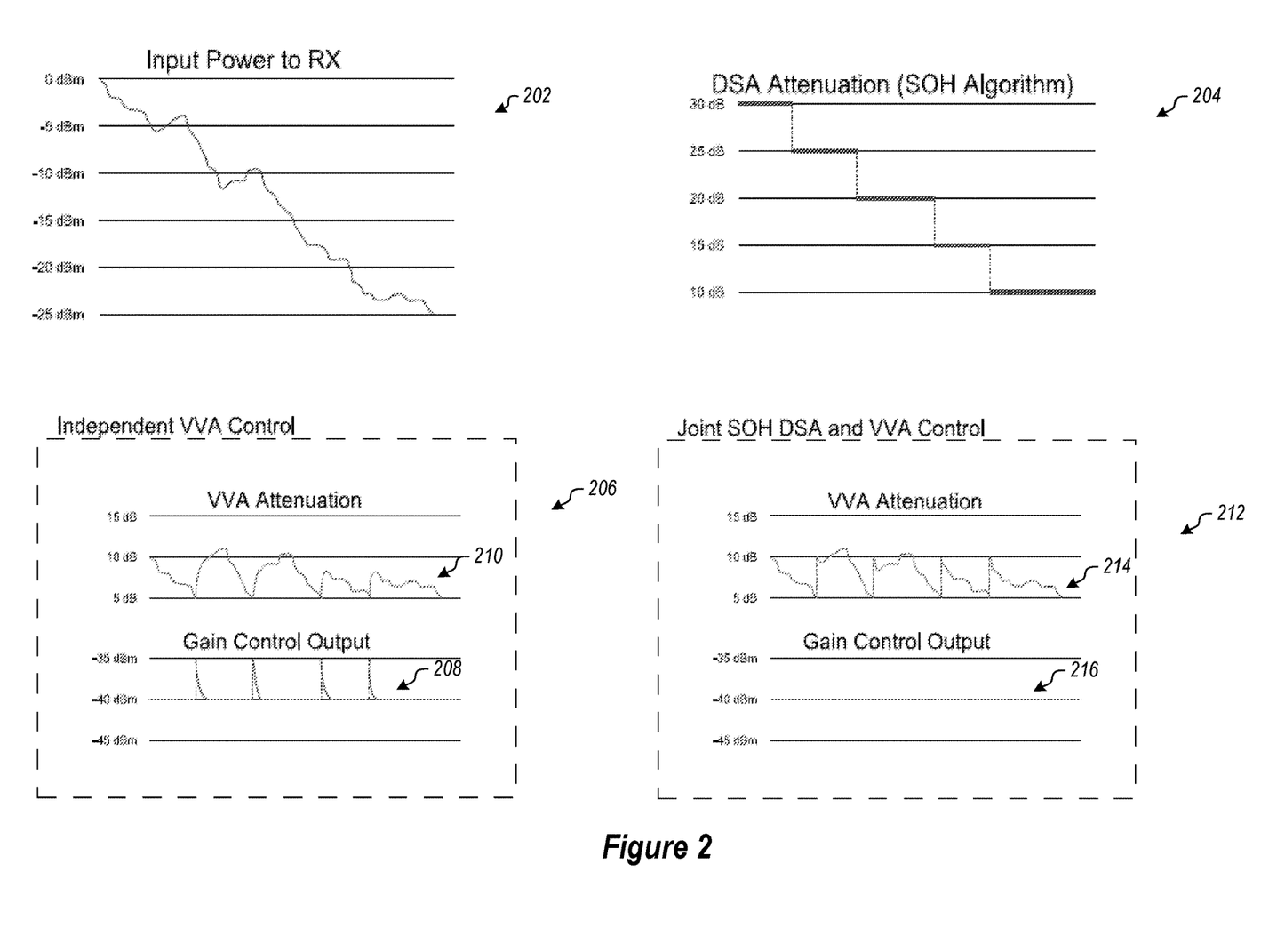
FIG. 2 illustrates various graphs illustrating signals and responses.

For example, attention is directed to FIG. 2 which illustrate a number of graphs showing input signal power strength, coarse attenuation by the step attenuator 102 and variable attenuation by the variable attenuator 104.

Graph 202 illustrates input power to the receiver 100. In this example, input power of the input 110 is generally declining over time from 0 dBm to −25 dBm. The controller 106 can measure input power, direction of power changes (i.e., increasing, decreasing, or substantially constant), and/or rate at which power is changing. The controller 106 can cause the step attenuator 102 to attenuate the input signal 110 based on this information. In particular, graph 204 illustrates attenuation by the step attenuator 102 over the same time.

For example, as illustrated at 204 of FIG. 2, the step attenuator 102 is configured to attenuate the input signal 110 in 5 dB increments, where the step attenuator increases or decreases attenuation, stepwise, based on measurements made on the input signal 110. In the example illustrated, the goal is to cause the power output to the detector 108 to be approximately −40 dBm. In the illustrated example, the step attenuator 102 and variable attenuator 104 are used in conjunction to achieve this result. However, embodiment coordinate timing between changes in attenuation of the step attenuator 102 and variable attenuator 104 to prevent output spikes, such as those seen in the graph 206 at the gain control output 208.

In particular, previous systems caused step attenuation to be performed followed by variable attenuation (such as the variable attenuation illustrated by the curve 210). For convenience, the prior example is illustrated using the curve illustrated in graph 204 as well as the curves illustrated in graph 206. In this example, as an input signal decreases, the step attenuator decreases attenuation from 30 dB to 25 dB. The variable attenuator had been constantly decreasing its attenuation from 10 dB to 5 dB, such that at this point in time, the variable attenuator is attenuating a signal from the step attenuator by 5 dB to cause a total attenuation of 35 dB, resulting in an output signal of −35 dBm. As illustrated in graph 206, this results in a 5 dB spike from −30 dBm to −35 dBm until the variable attenuator can be adjusted to compensate for the spike and then continue a continuous changing of attenuation as illustrated at curve 210 to compensate for the changes in the input signal illustrated by the curve in the graph 202. This occurs because in previous systems, control of the variable attenuator is reactive only to the output of the step attenuator and is independent of the control of the step attenuator.

This type of behavior can cause problems for demodulation functions and with forward error correction (FEC) decoding, as soft-decision decoders expect appropriately scaled symbol magnitudes. The magnitude jumps can wreak havoc on demodulation functions including timing and phase loops, lock detectors, sync detectors, and high order modulation symbol demapping. Even with Phase Shift Keying (PSK), soft decision FEC decoders will have degraded performance with inconsistent symbol magnitude. Using one or more DSA elements in line with a VVA allows locally (with respect to attenuation) smooth gain control and a large range of attenuation.

Embodiments illustrated herein enable smooth gain control over the entire range of supported attenuation values and, in some embodiments, prevent the above-mentioned distress on demodulation and FEC due to magnitude discontinuities. Embodiments herein are implemented such that control of the variable attenuator 104 is reactive to controls that are coordinated with the control of the step attenuator 102. That is, embodiments can be implemented where control of the variable attenuator 104 is not isolated from control of the step attenuator 102. In particular, attention is directed to graph 212 including curves 214 and 216. As illustrated, in this graph, the attenuation of the variable attenuator 104 is controlled in conjunction with the control of the step attenuator 102. In particular, rather than the more continuous control of the variable attenuator illustrated in by the curve 210, embodiments herein implement piecewise continuous control with points of stepped control of the variable attenuator 104, as illustrated by the curve 214.

In particular, as the input 110 decreases in power, the step attenuator 102 reduces attenuation by a stepped amount as illustrated in graph 204 and in conjunction, the variable attenuator 104 increases attenuation by a stepped amount, and thereafter decreases attention in a continuous fashion. This results in a more consistent output of the variable attenuator 104 (which is input to the detector 108). Thus, for example, when the step attenuator 102 steps from 30 dB attenuation to 25 dB as illustrated in graph 204, the variable attenuator 104 steps from 5 dB attenuation to 10 dB attenuation at the same time, or within a predetermined time (such as based on delays associated with control of the step attenuator 102 or variable attenuator 104) to prevent an output spike, The variable attenuator then continuously decreases attenuation to cause a continuous output of the gain control elements (i.e., the step attenuator 102 in combination with the variable attenuator 104) and a continuous input into the detector 108.

Thus, as illustrated, embodiments allow a gain control system to control the gain of a receiver in such a way that as the received signal strength varies widely, the received symbol magnitude after demodulation stays consistent.

As illustrated above, the input power of the input signal 110 can vary. This can be caused by any one of a number of reasons. For example, in some embodiments, the receiver 100 may be implemented on an aircraft or other mobile platform that moves away from or toward a transmitter 112. Thus, for example, if the receiver 100 is moving away from a transmitter 112, the input power of the input signal 110 may decrease in a fashion as illustrated in the graph 202. In contrast, if the receiver 100 is moving toward a transmitter 112, the input power of the input signal 110 may increase in a continuous fashion. One can imagine that in certain situations, the receiver may be in a changing environment where during certain periods the input power of the input signal 110 increases as the receiver 100 moves towards a transmitter 112 and then suddenly changes to a decreasing input power as the receiver 100 changes course causing the receiver 100 to move away from a transmitter 112. Note that the receiver 100 and a corresponding transmitter 112 may both be implemented on dynamic platforms such that movement between the platforms causes various periods of increasing power and decreasing power at the input 110. Alternatively, changing weather conditions, terrain, etc. can cause periods of increasing and decreasing power.

In the example illustrated in FIG. 1A, the controller 106 is able to monitor a number of different signals. For example, the controller 106 can monitor the input signal 110 being input into the step attenuator 102. FIG. 1A further illustrates that the controller 106 can monitor the output of the step attenuator 102. FIG. 1A further illustrates that the controller 106 can monitor the output of the variable attenuator 104. Using this information, the controller 106 can provide control signals to the step attenuator 102 and the variable attenuator 104 to control how attenuation is implemented in the receiver 100.

As noted previously, the ability of the controller 106 to monitor various signal strengths can also allow the controller 106 to determine how a signal is changing (e.g., is the signal increasing or decreasing in power) and rates at which the signal is changing. This can allow for fine-tuned control of the step attenuator 102 and the variable attenuator 104. In particular, this can be useful for eliminating and/or minimizing output spikes such as those seen in the curve 208 illustrated in FIG. 2.

In an alternative example, as illustrated in FIG. 1B, the controller 106 simply receives information from the detector 108 for the signal strength incident on the detector 108 and controls the step attenuator 102 and the variable attenuator 104. The variable attenuator 104 can be adjusted in a conventional closed-loop gain control until it reaches the edge of its linear region or some preset boundary in its linear region. At that point, the controller 106 steps the step attenuator 102 such that the variable attenuator 104 is once again in the center of its linear region. Then the variable attenuator 104 can continue to vary (+ and −attenuation) until the variable attenuator 104 once again reaches a boundary (on either side), thus implementing built-in hysteresis.

As a further explanation, imagine the variable attenuator 104 could affect attenuation in the range 0 to 20 dB, but it is only linear and well-behaved from 5 to 15 dB attenuation. Set the variable attenuator 104 to 10 dB attenuation. If the detector 108 has appropriate incident signal power upon it, the variable attenuator 104 attenuation will not change. If the power level measured at the detector 108 starts to vary from the desired incident power, the controller 106 will modify the variable attenuator 104 attenuation to compensate for the signal variation. However, if the variable attenuator 104 attenuation reaches 5 dB or 15 dB, the DSA steps 5 dB and the VVA is once again set to 10 dB attenuation and (with well-behaved continuous signals) the detector 108 is still receiving a signal that is an appropriate power level. But now, the input signal 110 can vary plus or minus 5 dB before the controller 106 controls 102 to step again.

Thus, in this example, the variable attenuator 104 operation can be viewed as a 10 dB window of operation and the DSA steps where this window is centered, in 5 dB steps. Thus, a 10 dB VVA window overlaps with 'neighboring' windows each by 5 dB (neighbor windows being those for which the DSA has stepped + or −5 dB).

Further, timing of changes to attenuation by the step attenuator 102 with respect to changes to attenuation by the variable attenuator 104 is an important factor to consider for eliminating and/or minimizing output spikes such as those seen in the curve 208 illustrated in FIG. 2. This timing can be accomplished in a number of different fashions. In particular, in some embodiments, there may be timing differences between when the step attenuator 102 changes attenuation by a particular step amount and when the variable attenuator 104 changes attenuation by a particular step amount as illustrated in the curve 214. These timing differences may be caused by differences in circuitry at the controller 106, differences in circuitry at the step attenuator 102 as compared to circuitry at the variable attenuator 104, etc. In some embodiments, these differences may be known, such that appropriate delays can be implemented to compensate for the differences. For example, if the step attenuator 102 is more responsive to control signals from the controller 106 than the variable attenuator 104 (meaning that the step attenuator 102 reacts more quickly to control signals from the controller 106 then the variable attenuator 104 reacts to control signals from the controller 106), then a delay can be implemented in the controller 106 with respect to control signals for the step attenuator 102 to cause the reactions to control signals of the step attenuator 102 and the variable attenuator 104 to be more aligned. This is particularly important when the step attenuator 102 implements a stepped change in attenuation and when the variable attenuator 104 implements a stepped change in attenuation. Embodiments can control timing of control signals to the step attenuator 102 and variable attenuator 104 to cause the stepped changes to occur at coinciding times. Note that the coinciding times may include some allowance for propagation delay of signals between the step attenuator 102 and the variable attenuator 104. Although, in many embodiments, this propagation delay between the step attenuator 102 and variable attenuator 104 will be negligible.

In some embodiments, the delay between control signals to the step attenuator 102 and the variable attenuator 104 may be variable and configurable based on signal sampling of the controller 106. In particular, the responsiveness of the step attenuator 102 and variable attenuator 104 to control signals from the controller 106 may change over time resulting in sufficient variation between the step signals of the step attenuator 102 and the variable attenuator 104 to cause output spikes if corrective actions are not taken. In some embodiments, this delay may be adjusted based on a calibration cycle performed prior to using the receiver 100 for receiving signals from the transmitter 112. For example, the receiver 100 or equipment associated with the receiver 100 may input a test signal into the step attenuator 102 and cause a step change in the step attenuator 102 and the variable attenuator 104. The response time of the change can be measured at the detector 108. Thus, for example, a fixed-power signal input is used while changing the DSA and VVA to determine the delay in the received power at the detector 108. Alternatively, a 'step response' may be measured so delay calibration could minimize the 'area' under power spike deviations. Alternatively, the delay can be adjusted over time while monitoring signal strengths to use a feedback control circuit to correct for power spikes in the output of the gain control circuitry. Thus, for example, as anomalies begin to develop out of the output of the variable attenuator 104, delay adjustments can be made to the delay to eliminate the anomalies.

Note that in some embodiments this continuous feedback mechanism and continuous adjustment of delay between control signals to the step attenuator 102 and the variable attenuator 104 may be performed under normal operating conditions when the transmitter 112 is transmitting input signal 110 to the receiver 100. Thus, embodiments allow for initial calibrations and/or continuous feedback and correction.

Note that while the example illustrated in FIG. 1A illustrates a single step attenuator 102, it should be appreciated that in other embodiments, multiple step attenuators can be used in conjunction with each other. For example, in some embodiments, each step attenuator comprises a single step and is only able to attenuate either 0 dB or 5 dB. In this case, a wide dynamic range could be implemented by implementing multiple step attenuators. For example, in the preceding example, ten step attenuators could achieve a dynamic range of 50 dB. In alternative examples, multiple step attenuators could be used together where each of the step attenuators accounts for some of the dynamic range with multiple steps, but are required to be used in conjunction with other step attenuators to achieve the full dynamic range.

Figure 3:
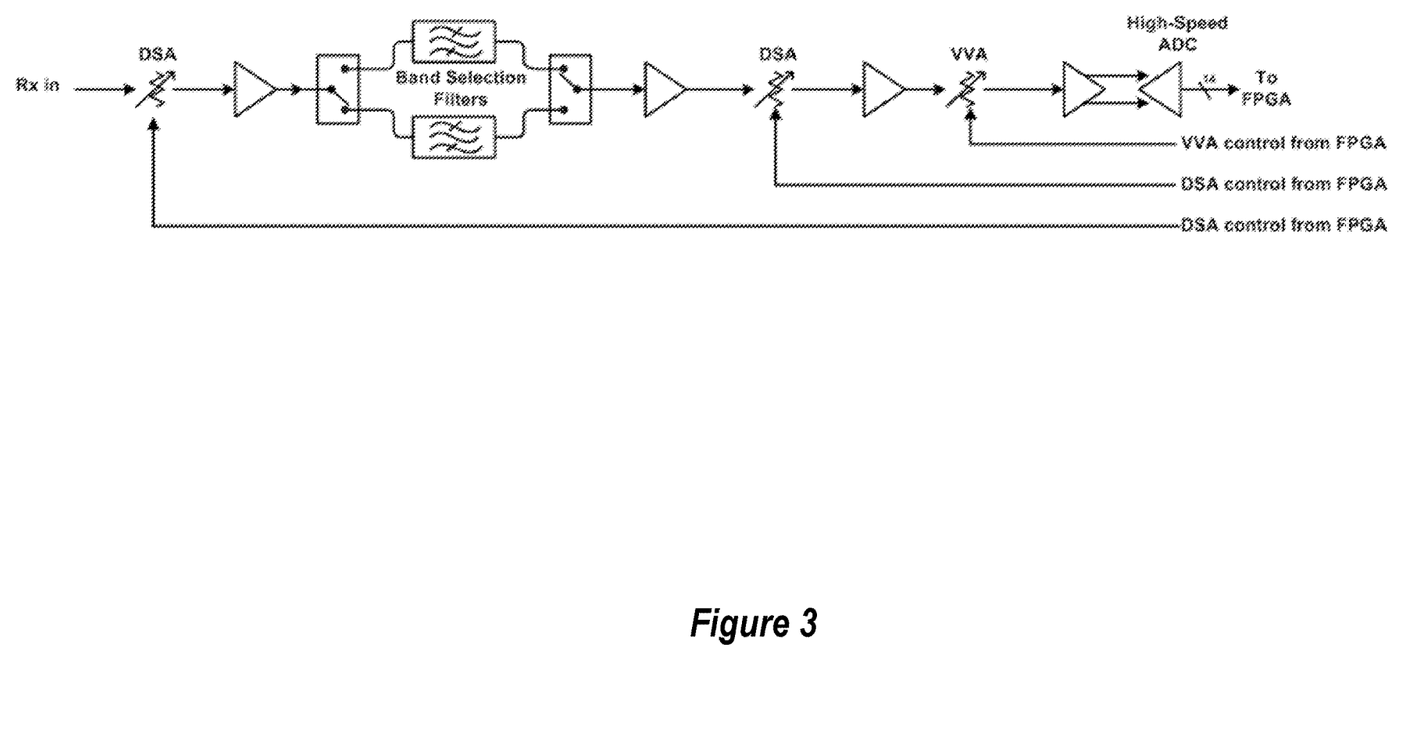
FIG. 3 illustrates a system for compensating for power spikes caused by steps in a DSA.

Still other embodiments may use multiple step attenuators in an overlapping fashion over portions of the dynamic range. For example, two step attenuators may be used where each of the step attenuators attenuates in 5 dB steps, but where each of the attenuators only steps on every 10 dB change on the input signal 110. However, the attenuators are configured to alternatively attenuate on 5 dB changes on the input signal 110. Thus, for example, a first attenuator may attenuate the input signal by 5 dB when the input signal is 0 dBm, −15 dBm, −25 dBm and so forth. In contrast, the second attenuator may attenuate the input signal by 5 dB when the input signal is −10 dBm, −20 dBm, and so forth. FIG. 3 illustrates one example implementation where multiple step attenuators are used with a variable voltage attenuator, where control is performed by a Field Programmable Gate Array (FPGA), or other appropriate mechanism, such as discrete circuitry, a microcontroller, software running on a general purpose processor, etc.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 4:
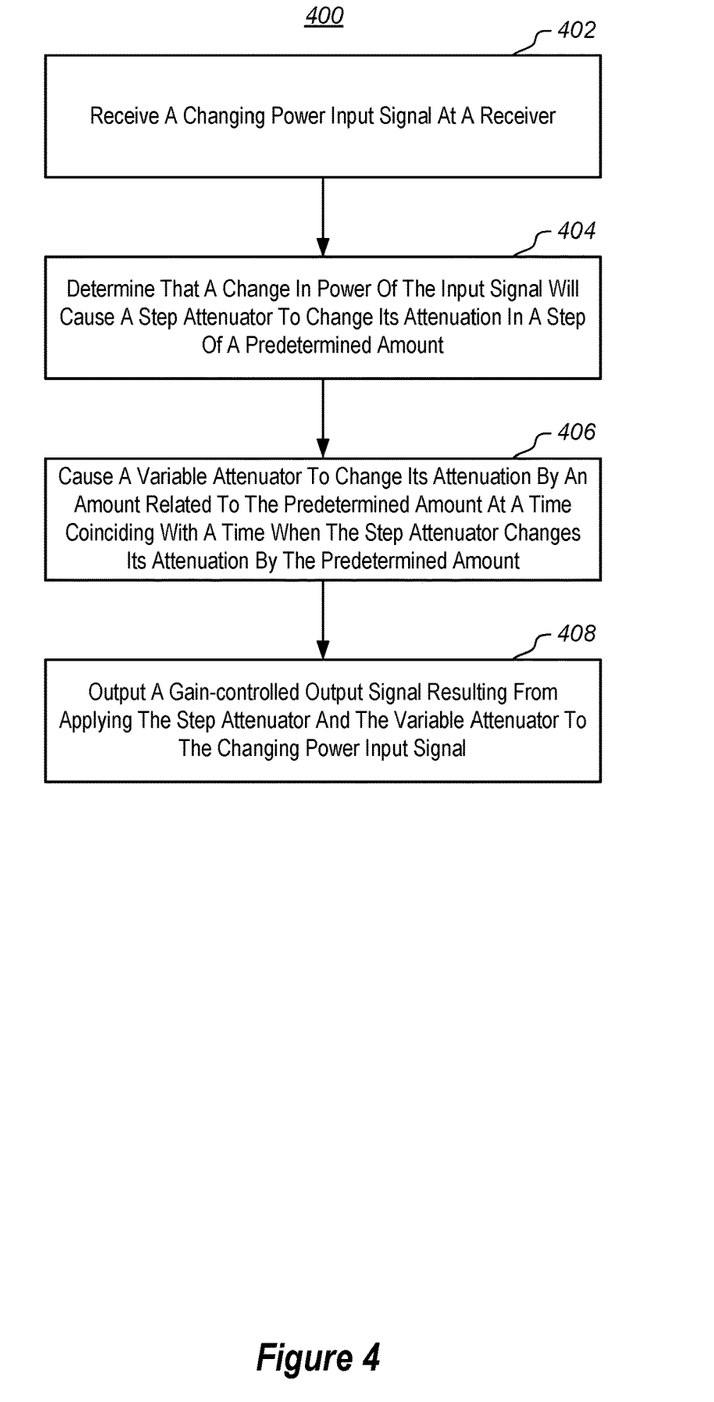
FIG. 4 illustrates a method for compensating for power spikes caused by steps in a DSA.

Referring now to FIG. 4, a method 400 is illustrated. The method 400 includes acts for signal processing to compensate for gain control output spikes caused by steps in a digital step attenuator. The method 400 includes receiving a changing power input signal at a receiver (act 402).

The method 400 further includes determining that a change in power of the input signal will cause a step attenuator to change its attenuation in a step of a predetermined amount (act 404).

Based on determining that the change in power of the input signal will cause a digital step attenuator to change its attenuation in a step of a predetermined amount, the method 400 further includes causing a variable attenuator to change its attenuation by an amount related to (e.g., could be the same) the predetermined amount at a time coinciding with a time when the step attenuator changes its attenuation by the predetermined amount (act 406).

The method 400 further includes outputting a gain-controlled output signal resulting from applying the step attenuator and the variable attenuator to the changing power input signal (act 408).

The method 400 may be practiced where causing the variable attenuator to change its attenuation by an amount related to the predetermined amount at time coinciding with a time when the step attenuator changes its attenuation by the predetermined amount is performed by triggering the variable attenuator to change its attenuation directly based on an amount of change of power in the input signal.

The method 400 may be practiced where causing the variable attenuator to change its attenuation by an amount related to the predetermined amount at time coinciding with a time when the step attenuator changes its attenuation by the predetermined amount is performed by triggering the variable attenuator to change its attenuation using a delay circuit to coordinate effects of the variable attenuator and the step attenuator.

The method 400 may further include performing a calibration cycle to determine timing differences between the variable attenuator and the step attenuator. In such embodiments, the method 400 may be practiced where causing the variable attenuator to change its attenuation by an amount related to the predetermined amount at time coinciding with a time when the step attenuator changes its attenuation by the predetermined amount is performed by triggering the variable attenuator to change its attenuation using information obtained from the calibration cycle.

Further, such embodiments may be practiced where using information obtained from the calibration cycle comprises triggering the variable attenuator to change its attenuation before power of the input signal changes sufficiently to trigger the step attenuator to change its attenuation in the step of the predetermined amount.

Alternatively or additionally, such embodiments may be practiced where using information obtained from the calibration cycle comprises triggering the variable attenuator to change its attenuation a determined amount of time after the power of the input signal changes sufficiently to trigger the step attenuator to change its attenuation in the step of the predetermined amount.

The method 400 may further include receiving continuous feedback from the variable attenuator and the step attenuator to determine timing differences between the variable attenuator and the step attenuator. Some such embodiments may be practiced where causing the variable attenuator to change its attenuation by an amount related to the predetermined amount at a time coinciding with a time when the step attenuator changes its attenuation by the predetermined amount is performed by triggering the variable attenuator to change its attenuation using information obtained from the feedback.

Further, such embodiments may be practiced where causing the variable attenuator to change its attenuation by an amount related to the predetermined amount at time coinciding with a time when the step attenuator changes its attenuation by the predetermined amount is performed by triggering the variable attenuator and the step attenuator using a gated circuit with a simultaneous trigger signal to the variable attenuator and the step attenuator.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. In a communication environment, a method of signal processing to compensate for gain control output spikes caused by steps in a digital step attenuator, the method comprising:
   receiving a changing power input signal at a receiver;
   determining that a change in power of the input signal will cause the digital step attenuator to change its attenuation in a step of a predetermined amount;
   based on determining that the change in power of the input signal will cause the digital step attenuator to change its attenuation in the step of the predetermined amount, causing a variable attenuator to change its attenuation by an amount related to the predetermined amount at a time coinciding with a time when the digital step attenuator changes its attenuation by the predetermined amount; and
   outputting a gain-controlled output signal resulting from applying the digital step attenuator and the variable attenuator to the changing power input signal.

2. The method of claim 1, wherein causing the variable attenuator to change its attenuation by the amount related to the predetermined amount at time coinciding with the time when the digital step attenuator changes its attenuation by the predetermined amount is performed by triggering the variable attenuator to change its attenuation directly based on an amount of change of power in the input signal.

3. The method of claim 1, wherein causing the variable attenuator to change its attenuation by the amount related to the predetermined amount at time coinciding with the time when the digital step attenuator changes its attenuation by the predetermined amount is performed by triggering the variable attenuator to change its attenuation using a delay circuit to coordinate effects of the variable attenuator and the digital step attenuator.

4. The method of claim 1, further comprising:
   performing a calibration cycle to determine timing differences between the variable attenuator and the digital step attenuator; and
   wherein causing the variable attenuator to change its attenuation by the amount related to the predetermined amount at time coinciding with the time when the digital step attenuator changes its attenuation by the predetermined amount is performed by triggering the variable attenuator to change its attenuation using information obtained from the calibration cycle.

5. The method of claim 4, wherein using information obtained from the calibration cycle comprises triggering the variable attenuator to change its attenuation before power of the input signal changes sufficiently to trigger the digital step attenuator to change its attenuation in the step of the predetermined amount.

6. The method of claim 4, wherein using information obtained from the calibration cycle comprises triggering the variable attenuator to change its attenuation a determined amount of time after the power of the input signal changes sufficiently to trigger the digital step attenuator to change its attenuation in the step of the predetermined amount.

7. The method of claim 1, further comprising:
   receiving continuous feedback from the variable attenuator and the digital step attenuator to determine timing differences between the variable attenuator and the step attenuator; and
   wherein causing the variable attenuator to change its attenuation by the amount related to the predetermined amount at the time coinciding with the time when the digital step attenuator changes its attenuation by the predetermined amount is performed by triggering the variable attenuator to change its attenuation using information obtained from the feedback.

8. The method of claim 1, wherein causing the variable attenuator to change its attenuation by the amount related to the predetermined amount at time coinciding with the time when the digital step attenuator changes its attenuation by the predetermined amount is performed by triggering the variable attenuator and the digital step attenuator using a gated circuit with a simultaneous trigger signal to the variable attenuator and the digital step attenuator.

9. In a communication environment, a system for signal processing configured to compensate for gain control output spikes, the system comprising:
   a receiver configured to receive a changing power input signal at the receiver;
   one or more step attenuators implemented in the receiver;
   one or more variable voltage attenuators coupled to the one or more step attenuators;
   a controller coupled to the one or more step attenuators, wherein the controller is configured to determine that a change in power of the input signal will cause the one or more step attenuators to change its attenuation in a step of a predetermined amount;
   wherein the controller is further configured to, based on determining that the change in power of the input signal will cause the one or more step attenuators to change its attenuation in the step of the predetermined amount, cause the one or more variable voltage attenuators to change its attenuation by an amount related to the predetermined amount at a time coinciding with a time when the one or more step attenuators changes its attenuation by the predetermined amount; and wherein the receiver is configured to output a gain-controlled output signal resulting from applying the one or more step attenuators and the one or more variable voltage attenuators to the changing power input signal.

10. The system of claim 9, wherein causing the one or more variable voltage attenuators to change its attenuation by the amount related to the predetermined amount at time coinciding with the time when the one or more step attenuators changes its attenuation by the predetermined amount is performed by triggering the one or more variable voltage attenuators to change its attenuation directly based on an amount of change of power in the input signal.

11. The system of claim 9, wherein causing the one or more variable voltage attenuators to change its attenuation by the amount related to the predetermined amount at time coinciding with the time when the one or more step attenuators changes its attenuation by the predetermined amount is performed by triggering the one or more variable voltage attenuators to change its attenuation using a delay circuit to coordinate effects of the one or more variable voltage attenuators and the one or more step attenuators.

12. The system of claim 9, wherein the controller is configured to perform a calibration cycle to determine timing differences between the one or more variable voltage attenuators and the one or more step attenuators; and wherein causing the one or more variable voltage attenuators to change its attenuation by the amount related to the predetermined amount at time coinciding with the time when the one or more step attenuators changes its attenuation by the predetermined amount is performed by the controller triggering the one or more variable voltage attenuators to change its attenuation using information obtained from the calibration cycle.

13. The system of claim 12, wherein using information obtained from the calibration cycle comprises triggering the one or more variable voltage attenuators to change its attenuation before power of the input signal changes sufficiently to trigger the one or more step attenuators to change its attenuation in the step of the predetermined amount.

14. The system of claim 12, wherein using information obtained from the calibration cycle comprises triggering the one or more variable voltage attenuators to change its attenuation a determined amount of time after the power of the input signal changes sufficiently to trigger the one or more step attenuators to change its attenuation in the step of the predetermined amount.

15. The system of claim 9, wherein the controller is configured to receive continuous feedback from the one or more variable voltage attenuators and the one or more step attenuators to determine timing differences between the one or more variable voltage attenuators and the one or more step attenuators; and wherein causing the one or more variable voltage attenuators to change its attenuation by the amount related to the predetermined amount at the time coinciding with a time when the one or more step attenuators changes its attenuation by the predetermined amount is performed by triggering the one or more variable voltage attenuators to change its attenuation using information obtained from the continuous feedback.

16. The system of claim 9, wherein causing the one or more variable voltage attenuators to change its attenuation by the amount related to the predetermined amount at time coinciding with the time when the one or more step attenuators changes its attenuation by the predetermined amount is performed by triggering the one or more variable voltage attenuators and the one or more step attenuators using a gated circuit with a simultaneous trigger signal to the one or more variable voltage attenuators and the one or more step attenuators.

17. A system comprising:
one or more processors; and
one or more computer-readable media having stored thereon instructions that are executable by the one or more processors to configure the computer system to compensate for gain control output spikes caused by steps in a digital step attenuator, including instructions that are executable to configure the system to perform at least the following:
receive a changing power input signal at a receiver;
determine that a change in power of the input signal will cause the digital step attenuator to change its attenuation in a step of a predetermined amount;
based on determining that the change in power of the input signal will cause the digital step attenuator to change its attenuation in the step of a predetermined amount, cause a variable attenuator to change its attenuation by an amount related to the predetermined amount at a time coinciding with a time when the digital step attenuator changes its attenuation by the predetermined amount; and
output a gain-controlled output signal resulting from applying the digital step attenuator and the variable attenuator to the changing power input signal.

18. The system of claim 17, wherein causing the variable attenuator to change its attenuation by the amount related to the predetermined amount at time coinciding with the time when the digital step attenuator changes its attenuation by the predetermined amount is performed by triggering the variable attenuator to change its attenuation directly based on an amount of change of power in the input signal.

19. The system of claim 17, wherein causing the variable attenuator to change its attenuation by the amount related to the predetermined amount at time coinciding with the time when the digital step attenuator changes its attenuation by the predetermined amount is performed by triggering the variable attenuator to change its attenuation using a delay circuit to coordinate effects of the variable attenuator and the digital step attenuator.

20. The system of claim 17 wherein the one or more computer-readable media further have stored thereon instructions that are executable by the one or more processors to configure the computer system to perform a calibration cycle to determine timing differences between the variable attenuator and the digital step attenuator; and wherein causing the variable attenuator to change its attenuation by the amount related to the predetermined amount at time coinciding with the time when the digital step attenuator changes its attenuation by the predetermined amount is performed by triggering the variable attenuator to change its attenuation using information obtained from the calibration cycle.

* * * * *